(12) United States Patent
Bojkov et al.

(10) Patent No.: US 12,002,866 B2
(45) Date of Patent: Jun. 4, 2024

(54) RADIO FREQUENCY DEVICES WITH PHOTO-IMAGEABLE POLYMERS AND RELATED METHODS

(71) Applicant: Qorvo US, Inc., Greensboro, NC (US)

(72) Inventors: Christo Bojkov, Plano, TX (US);
Zhi-Qi Li, Richardson, TX (US);
Michael Roberg, Evergreen, CO (US);
Harold Isom, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 328 days.

(21) Appl. No.: 17/377,755

(22) Filed: Jul. 16, 2021

(65) Prior Publication Data

US 2023/0018673 A1 Jan. 19, 2023

(51) Int. Cl.
*H01L 29/423* (2006.01)
*H01L 29/786* (2006.01)

(52) U.S. Cl.
CPC .... *H01L 29/4238* (2013.01); *H01L 29/42384* (2013.01); *H01L 29/78633* (2013.01)

(58) Field of Classification Search
CPC ........... H01L 29/4238; H01L 29/42384; H01L 29/78633; H01L 23/4821; H01L 29/20
See application file for complete search history.

(56) References Cited

U.S. PATENT DOCUMENTS

| | | | | |
|---|---|---|---|---|
| 2004/0231872 A1* | 11/2004 | Arnold | ............... | H01L 23/49838 257/E23.128 |
| 2011/0012214 A1* | 1/2011 | Beer | ................... | B81C 1/00333 257/E29.324 |
| 2022/0223685 A1* | 7/2022 | Lin | ..................... | H01L 23/3192 |

OTHER PUBLICATIONS

Author Unknown, "Stability and stabilization of polymers under irradiation," International Atomic Energy Agency (IAEA), Jan. 1999, Vienna, Austria, 142 pages.
Wangler, N. et al. "High-resolution permanent photoresist laminate TMMF for sealed microfluidic structures in biological applications," Journal of Micromechanics and Microengineering, vol. 21, No. 9, Aug. 4, 2011, IOP Publishing Ltd, 9 pages.

\* cited by examiner

*Primary Examiner* — Mohammed R Alam
(74) *Attorney, Agent, or Firm* — Withrow & Terranova, P.L.L.C.

(57) ABSTRACT

RF devices, and more particularly RF devices with photo-imagable polymers for high frequency enhancements and related methods are disclosed. High frequency enhancements are realized by providing air cavities registered with one or more operating portions of RF devices. The air cavities are formed by photo-imagable polymer structures that provide separation from high dielectric constant materials associated with sealing materials, such as overmold materials, that are typically used for environmental and/or mechanical protection in RF devices. Related methods are disclosed that include forming the photo-imagable polymer structures and corresponding air cavities through various lamination and patterning of photo-imagable polymer layers. Further radiation hardening steps are disclosed that may be applied to the photo-imagable polymer structures after air cavities are formed to promote improved structural integrity of the air cavities during subsequent fabrication steps and during operation of the RF devices.

24 Claims, 17 Drawing Sheets

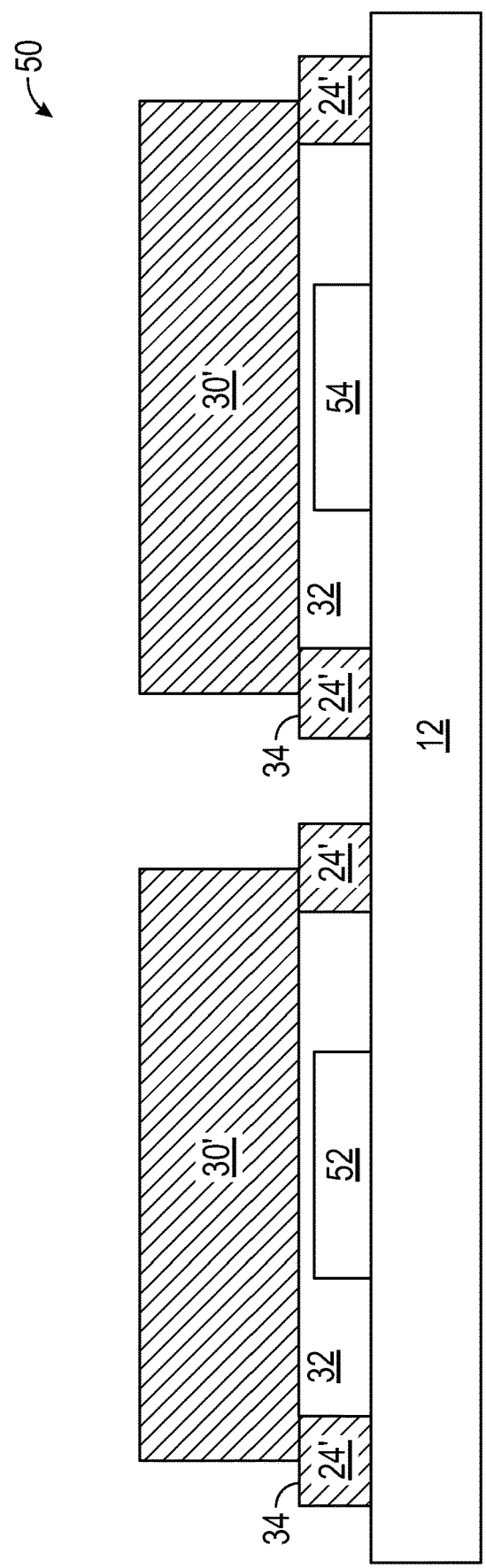

RADIO FREQUENCY DEVICES WITH PHOTO-IMAGEABLE POLYMERS AND RELATED METHODS

FIELD OF THE DISCLOSURE

The present disclosure relates to radio frequency (RF) devices, and more particularly to RF devices with photo-imagable polymers for high frequency enhancements and related methods.

BACKGROUND

Radio frequency (RF) devices, including those based on gallium nitride (GaN) and gallium arsenide (GaAs) materials, and related modules are integral elements for enabling advancements in various modern technologies, including mobile communication, infrastructure, defense, aerospace, and internet of things applications. Wireless communication networks have continued to evolve in order to keep up with ever increasing data transmission demands of modern technology. With each new generation of cellular network technology, higher integration and smaller device sizes are needed to provide improved data capacity, connectivity, and coverage. Advanced cellular networks, including fifth generation (5G) and beyond, seek to leverage a broader range of frequency bands and power levels to deliver improved speed and efficiency of data transmissions with lower latency. Innovations enabled by advanced cellular networks may include massive internet of things devices for machine-to-machine communications, mission critical services, and enhanced mobile broadband (eMBB). Mission critical services may include autonomous driving, autonomous mass transit systems, industrial automation, remote healthcare, and smart grid monitoring and control. Applications related to eMBB may enable densification of mobile networks, fixed wireless access, augmented reality, virtual reality, and gaming among others.

As advanced radio frequency systems and cellular networks continue to evolve, challenges exist to implement devices operable for higher frequency ranges, switching speeds, and power handling requirements. These demands continually raise the complexity of radio frequency devices and systems and there is a constant need for performance improvements. As advancements in modern radio frequency technology progress, the art continues to seek improved devices and systems capable of overcoming such challenges.

SUMMARY

Aspects disclosed herein relate to radio frequency (RF) devices, and more particularly to RF devices with photo-imagable polymers for high frequency enhancements and related methods. High frequency enhancements may be realized by providing air cavities registered with one or more operating portions of RF devices. The air cavities may be formed by photo-imagable polymer structures that provide separation from high dielectric constant materials associated with sealing materials, such as overmold materials, that are typically used for environmental and/or mechanical protection in RF devices. Related methods are disclosed that include forming the photo-imagable polymer structures and corresponding air cavities through various lamination and patterning of photo-imagable polymer layers. Further radiation hardening steps are disclosed that may be applied to the photo-imagable polymer structures after the air cavities are formed to promote improved structural integrity of the air cavities during subsequent fabrication steps and during operation of the RF devices.

In one aspect, a device comprises: a substrate; a field-effect transistor (FET) on the substrate, the FET comprising at least one gate electrode; and a photo-imagable polymer structure on the substrate and over the at least one gate electrode, wherein the photo-imagable polymer structure forms an air cavity over the at least one gate electrode. In certain embodiments, the photo-imagable polymer structure comprises at least one wall on the substrate that is peripherally arranged around the at least one gate electrode. In certain embodiments, a height of the at least one wall in a direction perpendicular to the substrate is greater than a height of the at least one gate electrode in a direction perpendicular to the substrate. In certain embodiments, the photo-imagable polymer structure further comprises a lid that resides on the at least one wall such that the at least one wall is arranged between the lid and the substrate, wherein the lid is spaced above the gate electrode to form the air cavity. In certain embodiments, the lid and the at least one wall comprise a same photo-imagable polymer. The lid and the at least one wall may form a unitary element for the photo-imagable polymer structure. In certain embodiments, the lid and the at least one wall form a step along one or more sidewalls of the photo-imagable polymer structure. A thickness of the lid may be greater than a thickness of the at least one wall. In certain embodiments, the thickness of the at least one wall is in a range from 10 microns ($\mu$m) to 30 $\mu$m and the thickness of the lid is in a range from 20 $\mu$m to 70 $\mu$m. The device may further comprise an overmold material, wherein the photo-imagable polymer structure is embedded within the overmold material. The device may further comprise a support element on which the FET is mounted, wherein the overmold material is arranged to encapsulate the FET and photo-imagable polymer structure. In certain embodiments, the FET is flip-chip mounted to the support element and the overmold material is arranged between the photo-imagable polymer structure and the support element. The device may further comprise one or more conductive pillars that are arranged to extend through the overmold material to provide one or more electrical connections between the FET and the support element.

In another aspect, a method comprises: forming a FET on a substrate, the FET comprising at least one gate electrode; and forming a photo-imagable polymer structure on the substrate and over the at least one gate electrode, wherein the photo-imagable polymer structure forms an air cavity over the at least one gate electrode. The method may further comprise applying radiation to harden the photo-imagable polymer structure after the air cavity is formed. In certain embodiments, the radiation is provided by a radiation source that comprises at least one of an electron beam source, an ultraviolet source, and an x-ray source. In certain embodiments, the photo-imagable polymer structure comprises at least one wall and a lid that resides on the at least one wall to form the air cavity. In certain embodiments, the lid and the at least one wall form a step along one or more sidewalls of the photo-imagable polymer structure. In certain embodiments, the at least one wall is formed by laminating a first photo-imagable polymer layer on the FET and selectively polymerizing or crosslinking portions of the first photo-imagable polymer; and the lid is formed by laminating a second photo-imagable polymer layer on the at least one wall and selectively polymerizing or crosslinking portions of the second photo-imagable polymer. The method may further comprise applying radiation to harden the lid and the at least one wall. The method may further comprise molding an overmold material to enclose the photo-imagable polymer structure after hardening of the lid and the at least one wall.

In another aspect, a monolithic device comprises: a substrate; at least one of an active device and a passive device on the substrate; and a photo-imagable polymer structure on the substrate, wherein the photo-imagable polymer structure forms an air cavity that is over at least one of a portion of the active device and a portion of the passive device. In certain embodiments, the air cavity is over the entire active device. In certain embodiments, the air cavity is over the entire passive device. In certain embodiments, the air cavity is over at least a portion of both the active device and the passive device. In certain embodiments, the air cavity is over the portion of the active device, and the active device comprises at least one of a transistor and a diode. In certain embodiments, the air cavity is over the portion of the passive device, and the passive device comprises at least one of an interconnect, a capacitor, an inductor, a resistor, a filter, a transformer, and a coupler.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 13 is a cross-sectional view of a device that includes at least one of an active device and a passive device with one or more photo-imagable polymer structures and corresponding air cavities.

DETAILED DESCRIPTION

Figure 1:
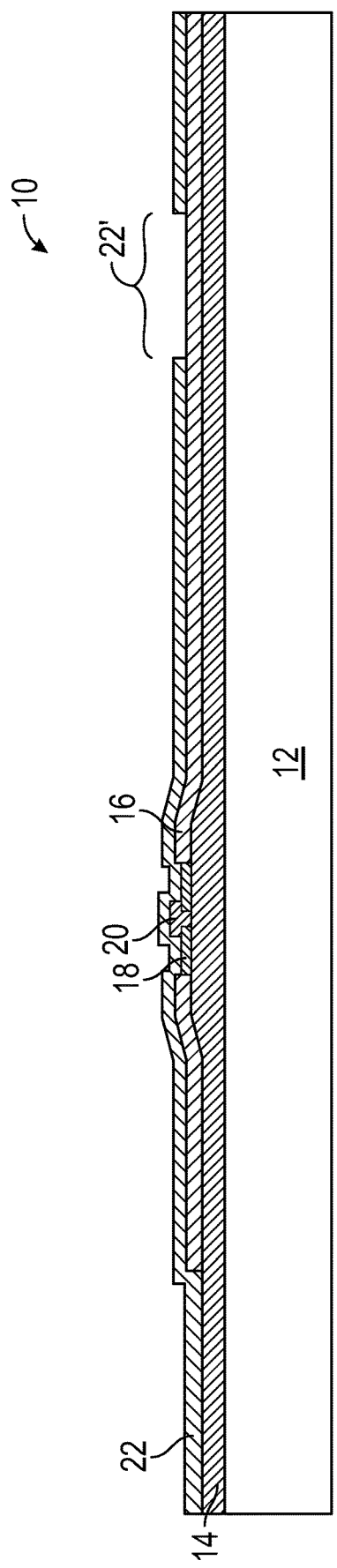
FIG. 1 is a cross-sectional view of a field-effect transistor (FET) at a fabrication step before formation of an air cavity according to the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to RF devices, and more particularly to RF devices with photo-imagable polymers for high frequency enhancements and related methods. High frequency enhancements may be realized by providing air cavities registered with one or more operating portions of RF devices. The air cavities may be formed by photo-imagable polymer structures that provide separation from high dielectric constant materials associated with sealing materials, such as overmold materials, that are typically used for environmental and/or mechanical protection in RF devices. Related methods are disclosed that include forming the photo-imagable polymer structures and corresponding air cavities through various lamination and patterning of photo-imagable polymer layers. Further radiation hardening steps are disclosed that may be applied to the photo-imagable polymer structures after the air cavities are formed to promote improved structural integrity of the air cavities during subsequent fabrication steps and during operation of the RF devices.

Devices and modules for radio frequency applications typically include various discrete circuit elements, including capacitors, resistors, inductors, resonators, filters, and semiconductor switching devices such as field-effect transistors (FETs), among others. In various applications, the discrete circuit elements may be encapsulated or embedded within a sealing material that provides protection from environmental ingress of moisture and/or other impurities that would otherwise negatively impact operating characteristics of the discrete circuit elements. Such sealing materials are also provided for mechanical protection, including scratch resistance, of underlying circuit elements. The sealing material may be referred to as an overmold material when molded on the discrete circuit elements. Overmold and/or sealing materials are typically formed of a dielectric material, such as benzocyclobutene (BCB), polybenzoxazole (PBO), and/or various polyimides. While providing suitable environmental protection, the dielectric materials of the overmold material may adversely limit operation of certain underlying devices. For example, the above-specified dielectric materials have relatively high dielectric constants that can create loss during operation of FETs, thereby limiting high frequency operation. According to embodiments of the present disclosure, structures are provided that form air cavities over one or more portions of the discrete circuit elements, thereby allowing the circuit elements to operate in low dielectric constant environments provided by the air cavities. In the example of a FET, the air cavity may be formed over at least the gate thereof to provide separation between the FET and the subsequently formed overmold material. In this regard, the FET may be protected from environmental exposure with the overmold material while also separating the high dielectric constant of the overmold material from the FET by way of the air cavity.

FIGS. 1-12B are provided in the context of a discrete circuit element that includes an air cavity that avoids direct contact between the circuit element and a corresponding overmold material. For illustrative purposes, the discrete circuit element in FIGS. 1-12B is provided as a FET; however, it is readily understood that the principles described are applicable to various discrete circuit elements, including active devices such as transistors and diodes and/or passive devices such as interconnects, capacitors, inductors, resistors, filters, transformers, and couplers. As described in greater detail below, FIGS. 1-12B are provided as various fabrication steps for forming an air cavity between an overmold material and an enclosed circuit element according to principles of the present disclosure.

FIG. 1 is a cross-sectional view of a FET 10 at a fabrication step before formation of an air cavity according to the present disclosure. The exemplary FET 10 may include a substrate 12, one or more device layers 14, one or more metallization layers 16, one or more dielectric layers 18, at least one gate electrode 20, and one or more protective overcoat layers 22. The substrate 12 may comprise a gallium arsenide (GaAs) substrate when the one or more device layers 14 are formed from GaAs-based materials. In other embodiments, the substrate 12 may comprise a silicon carbide substrate when the one or more device layers 14 are formed from gallium nitride (GaN) based materials. The one or more metallization layers 16 may form various electrical connections for the FET 10, such as source and/or drain connections. As illustrated, the one or more dielectric layers 18 may be arranged to prevent electrical shorting between the gate electrode 20 and the one or more metallization layers 16. By way of example, the one or more dielectric layers 18 may comprise silicon nitride. In certain embodiments, one or more openings 22' may be formed in the one or more protective overcoat layers 22 to provide pathways for a later-formed external electrical connections for the FET 10. For illustrative purposes, a single opening 22' is illustrated in the cross-sectional view of FIG. 1; however, it is understood that a plurality of the openings 22' may be provided for forming pathways for a plurality of later-formed electrical connections or other purposes for the FET 10. For example, separate electrical connections may be provided for each of the source, gate, and drain of the FET 10. Other purposes for various ones of the openings 22' include providing a pathway for an electrical probe to provide testing functions during device fabrication. In such examples, certain openings 22' may be used for testing purposes while other openings 22' may be used for the later-formed electrical connections of the FET 10.

Figure 2:
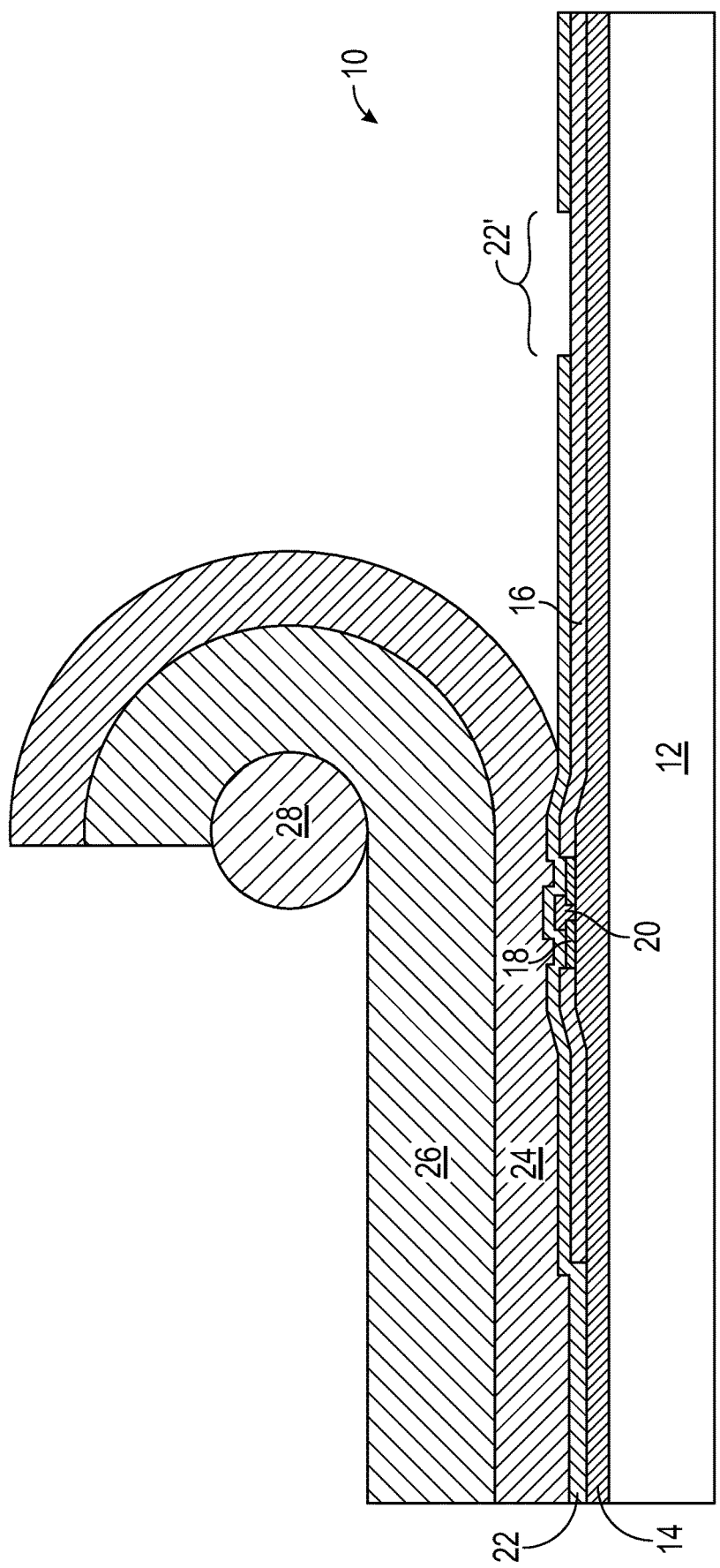
FIG. 2 is a cross-sectional view of the FET of FIG. 1 during a first lamination step for forming the air cavity according to the present disclosure.

FIG. 2 is a cross-sectional view of the FET 10 of FIG. 1 during a first lamination step for forming an air cavity according to the present disclosure. In FIG. 2, a laminate structure that includes a first photo-imagable polymer 24 and a support film 26 is laminated in a conformal manner over a surface of the FET 10 by way of a roller 28. In certain embodiments, the first photo-imagable polymer 24 comprises a dry-film photoresist layer, such as an epoxy-based photoresist, that is provided on the support film 26. The first photo-imagable polymer 24 may embody a negative photoresist that is polymerized and/or crosslinked with radiation exposure. A commercially available material for the first photo-imagable polymer 24 may include the dry-film photoresist TMMF (from Tokyo Ohka Kogyo Co., Ltd). The support film 26 may include a polyester film of a stretched polyethylene terephthalate (PET), such as biaxially-oriented polyethylene terephthalate (BoPET). By laminating the first photo-imagable polymer 24 over the FET 10 with the roller 28, the first photo-imagable polymer 24 may be suitably adhered to the surface of the FET 10 in manner that avoids bubbles and peeling. The first photo-imagable polymer 24 may be provided with a suitable thickness and/or a height in a direction perpendicular to the substrate 12 to form the later-described air cavity and provide a planarized top surface of the first photo-imagable polymer 24 above the FET 10. Depending on the relative height of the underlying circuit element, in this example the FET 10 including the gate electrode 20, the first photo-imagable polymer 24 may comprise a height and/or thickness in a range from 10 microns (μm) to 30 μm, or in a range from 15 μm to 25 μm, or about 20 μm, or any of the above-specified values with a tolerance of +/−10%.

Figure 3:
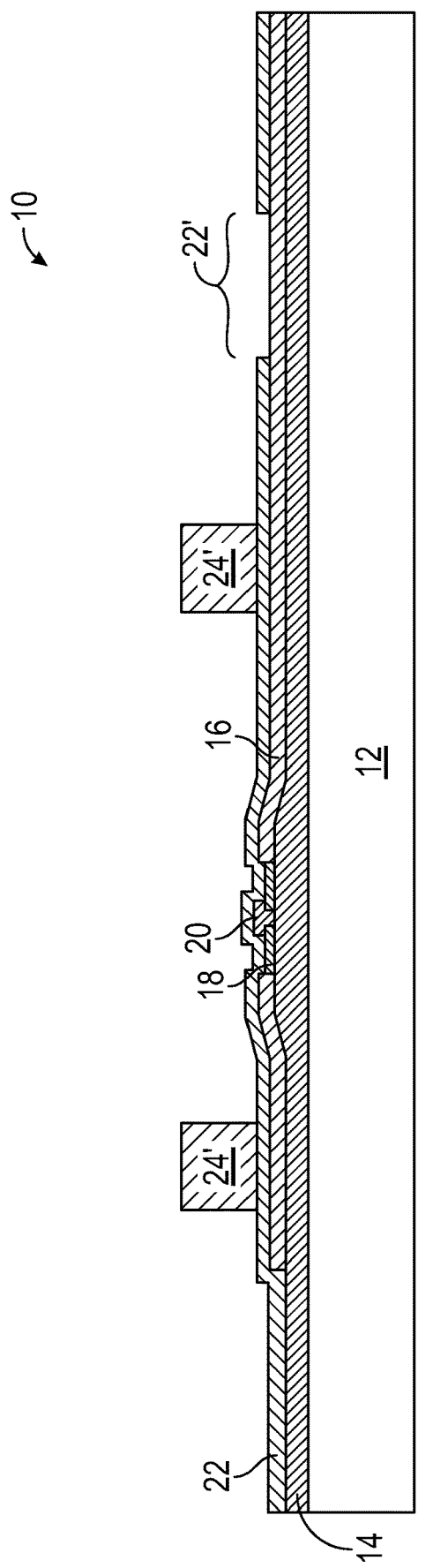
FIG. 3 is a cross-sectional view of the FET of FIG. 2 after a lithography step for forming at least one wall from a first photo-imagable polymer of FIG. 2.

FIG. 3 is a cross-sectional view of the FET 10 of FIG. 2 after a lithography step for forming at least one wall 24' from the first photo-imagable polymer 24 of FIG. 2. By way of example, selective polymerizing and/or crosslinking of portions of the first photo-imagable polymer 24 of FIG. 2 to form the wall 24' of FIG. 3 may be achieved by exposure through a patterned mask, followed by removal of the other portions of the first photo-imagable polymer 24 of FIG. 2. While shown in the cross-sectional view of FIG. 3, the wall 24' may be peripherally arranged around one or more portions of the FET 10, including the gate electrode 20. In certain embodiments, the wall 24' may laterally surround such portions of the FET 10 in a continuous manner. In such arrangements, the wall 24' may form one or more walls of the later-formed air cavity. A height in a direction perpendicular to the substrate 12 and/or a thickness of the wall 24' may include any of the above-specified height and/or thickness values for the first photo-imagable polymer 24 as described for FIG. 2. In certain embodiments, the FET 10 may be subjected to a cleaning process after the lithography step that forms the wall 24' in order to remove any residues that remain.

Figure 4:
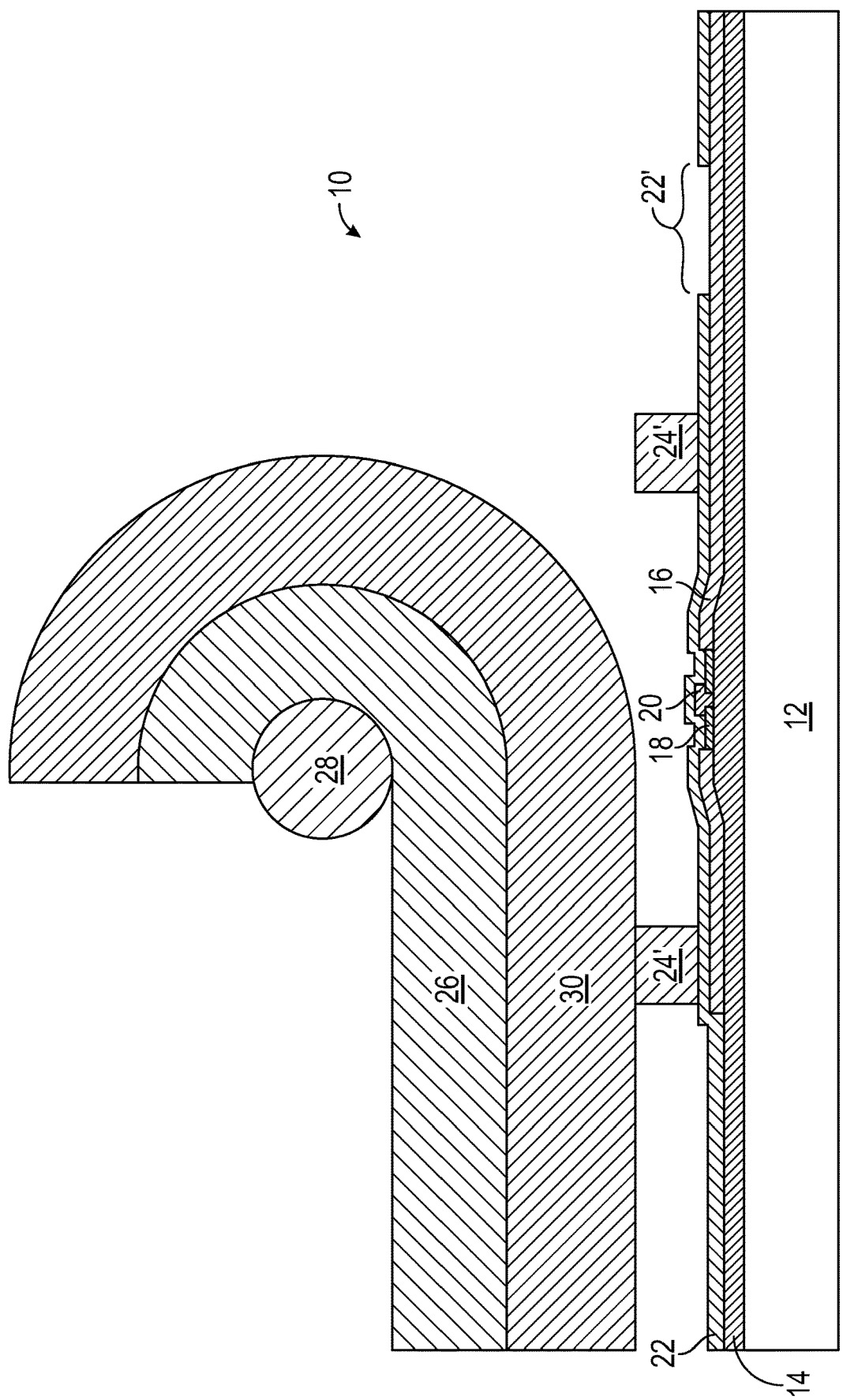
FIG. 4 is a cross-sectional view of the FET of FIG. 3 during a second lamination step for forming an air cavity according to the present disclosure.

FIG. 4 is a cross-sectional view of the FET 10 of FIG. 3 during a second lamination step for forming an air cavity according to the present disclosure. In FIG. 4, a laminate structure that includes a second photo-imagable polymer 30 is laminated over a surface of the FET 10 and the wall 24'. The laminate structure of the second lamination step may include another one of the support film 26 as described for FIG. 2 and the laminate structure may be provided over the FET 10 and the wall 24' with the roller 28. In certain embodiments, the second photo-imagable polymer 30 comprises a same material as the first photo-imagable polymer 24 of the wall 24'. In other embodiments, the second photo-imagable polymer 30 may comprise a different material of a dry-film photoresist layer than the first photo-imagable polymer 24 of the wall 24' without deviating from principles of the present disclosure. As illustrated, the second photo-imagable polymer 30 is separated from other portions of the FET 10 by the wall 24'. In this manner, the second photo-imagable polymer 30 is arranged to adhere to a top surface of the wall 24' and laterally extend across portions of the FET 10 with a separation from the FET 10 defined by the thickness of the wall 24'. In certain embodiments, the second photo-imagable polymer 30 may comprise a thickness in a range from 20 μm to 70 μm, or in a range from 35 μm to 55 μm, or about 45 μm, or any of the above-specified values with a tolerance of +/−10%. In this regard, the second photo-imagable polymer 30 may comprise a thickness that is greater than the thickness of the first photo-imagable polymer 24 of the wall 24'. In certain embodiments, such an arrangement may provide increased rigidity for the second photo-imagable polymer 30 to avoid sagging between portions of the wall 24'.

Figure 5:
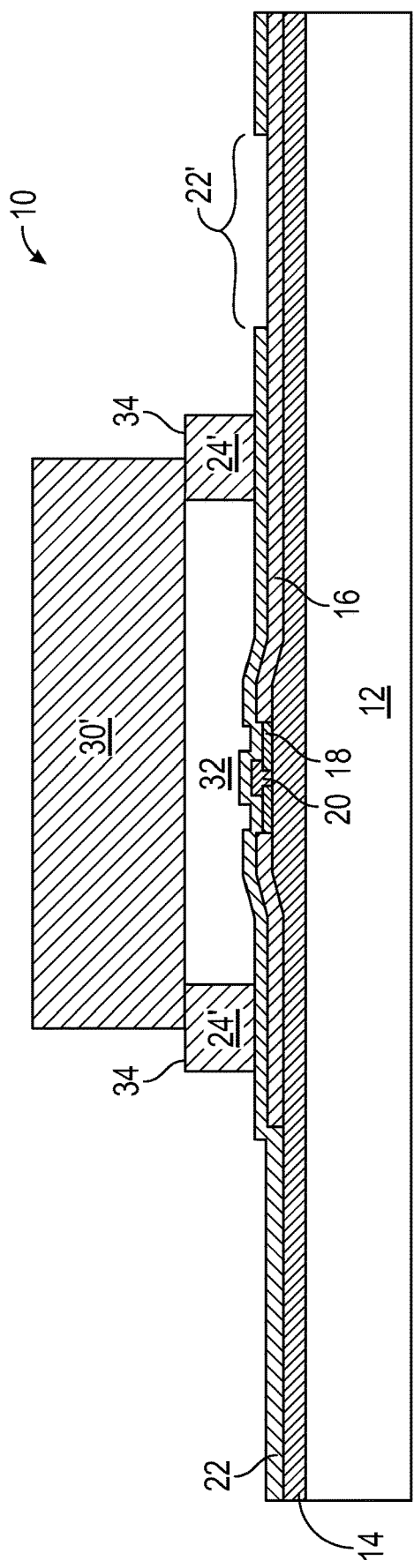
FIG. 5 is a cross-sectional view of the FET of FIG. 4 after a lithography step for forming at least one lid from a second photo-imagable polymer of FIG. 4.

FIG. 5 is a cross-sectional view of the FET 10 of FIG. 4 after a lithography step for forming at least one lid 30' from the second photo-imagable polymer 30 of FIG. 4. By way of example, polymerizing and/or crosslinking of portions of the second photo-imagable polymer 30 of FIG. 4 to form the lid 30' of FIG. 5 may be achieved by exposure through a patterned mask, followed by removal of the other portions of the second photo-imagable polymer 30 of FIG. 4. In certain embodiments, the FET 10 may then be subjected to another cleaning process to remove any residues that remain. As illustrated, a photo-imagable polymer structure is formed by the wall 24' and the lid 30' over portions of the FET 10. In this regard, the wall 24' and lid 30' are arranged to form an air cavity 32 over one or more portions of the FET 10. After the polymerizing and/or crosslinking to form the lid 30', the wall 24' and the lid 30' may collectively form a continuous and unitary element for the photo-imagable polymer structure. As illustrated in FIG. 5, the air cavity 32 may be provided over at least the portion of the FET 10 where the gate electrode 20 contacts the one or more device layers 14. In this manner, the air cavity 32 may be registered with portions of the FET 10 that are subjected to high frequency switching during operation, thereby providing a low dielectric constant operating environment. A thickness of the lid 30' may include any of the above-specified thickness values for the second photo-imagable polymer 30 as described for FIG. 4. By providing the lid 30' with a greater thickness than the at least one wall 24' in certain embodiments, the lid 30' may exhibit increased rigidity to reduce and/or avoid sagging.

In certain embodiments, the lid 30' may be arranged to reside on the wall 24' such that a step 34 is formed. Accordingly, the photo-imagable polymer structure is formed by the wall 24' and the lid 30' and further includes the step 34 along one or more sidewalls of the photo-imagable polymer structure. In certain arrangements, the step 34 may be continuously arranged around the entire photo-imagable polymer structure. By forming the step 34, the areas of vertical sidewall portions of the photo-imagable polymer structure may be reduced. Accordingly, improved adherence of subsequently formed layers may be improved, thereby improving mechanical stability of the photo-imagable polymer structure and any other materials formed thereon. For illustrative purposes, a single step 34 is shown on each sidewall; however, multiple steps 34 may be formed along each sidewall of the photo-imagable polymer structure by repeating the lamination and lithography steps of FIG. 5 with progressively decreasing lateral dimensions of the lid 30'.

Figure 6:
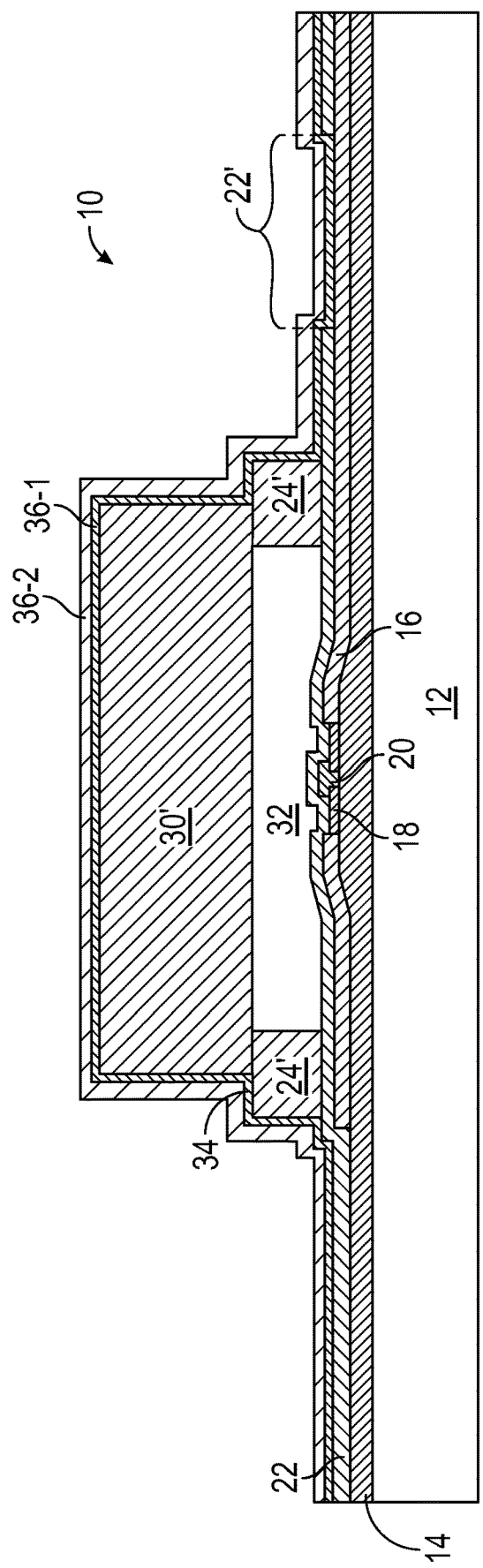
FIG. 6 is a cross-sectional view of the FET of FIG. 5 after seed layer deposition for providing one or more external electrical connections for the FET.

FIG. 6 is a cross-sectional view of the FET 10 of FIG. 5 after seed layer deposition for providing one or more external electrical connections for the FET 10. The seed layer deposition may include depositing one or more metal layers 36-1, 36-2 over the FET 10 and in particular within the one or more openings 22' of the one or more protective overcoat layers 22. In certain embodiments, the metal layers 36-1, 36-2 may be deposited, for example, by physical vapor deposition (PVD). In a particular example, a first metal layer 36-1 may comprise titanium tungsten (TiW) and a second metal layer 36-2 may comprise copper (Cu), although other metals and metal alloys may also be used. As illustrated, the metal layers 36-1, 36-2 are arranged to provide an electrical connection with the metallization layers 16 of the FET 10. The metal layers 36-1, 36-2 may be blanket deposited over the FET 10 and the steps 34 in a conformal manner. In this regard, the presence of the steps 34 may improve adherence of the metal layers 36-1, 36-2 during subsequent fabrication processes.

Figure 7:
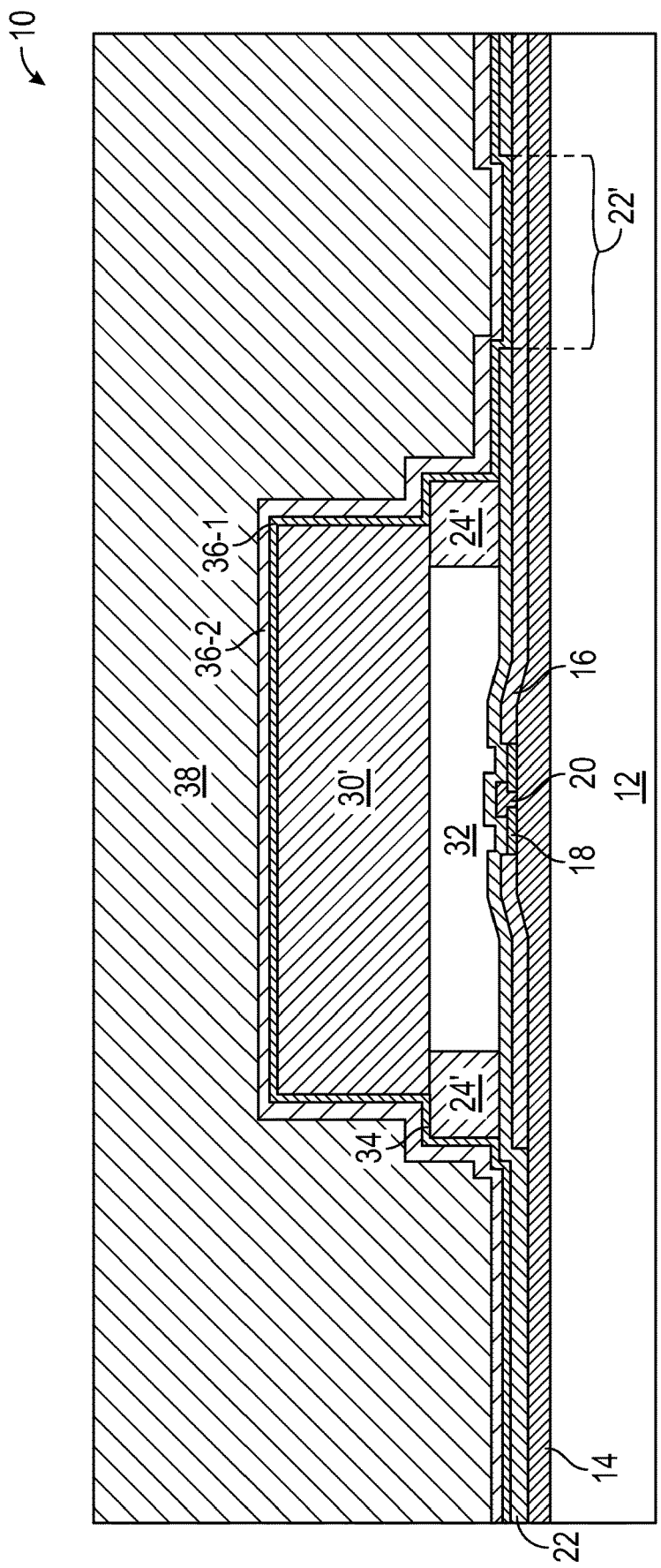
FIG. 7 is a cross-sectional view of the FET of FIG. 6 after plating of a photo-imagable resist layer over the FET.

FIG. 7 is a cross-sectional view of the FET 10 of FIG. 6 after plating of a photo-imagable resist layer 38 over the FET 10. In certain embodiments, the photo-imagable resist layer 38 comprises a dry film photoresist layer. The photo-imagable resist layer 38 is formed over the metal layers 36-1, 36-2 and the underlying photo-imagable polymer structure and the FET 10, including portions of the FET 10 that are registered with the one or more openings 22'. The fabrication process for forming the photo-imagable resist layer 38, which may include a lamination step similar to the steps illustrated for FIGS. 2 and 4, may be provided to promote planarization of the photo-imagable resist layer 38 with suitable adhesion and reduced bubble formation.

Figure 8:
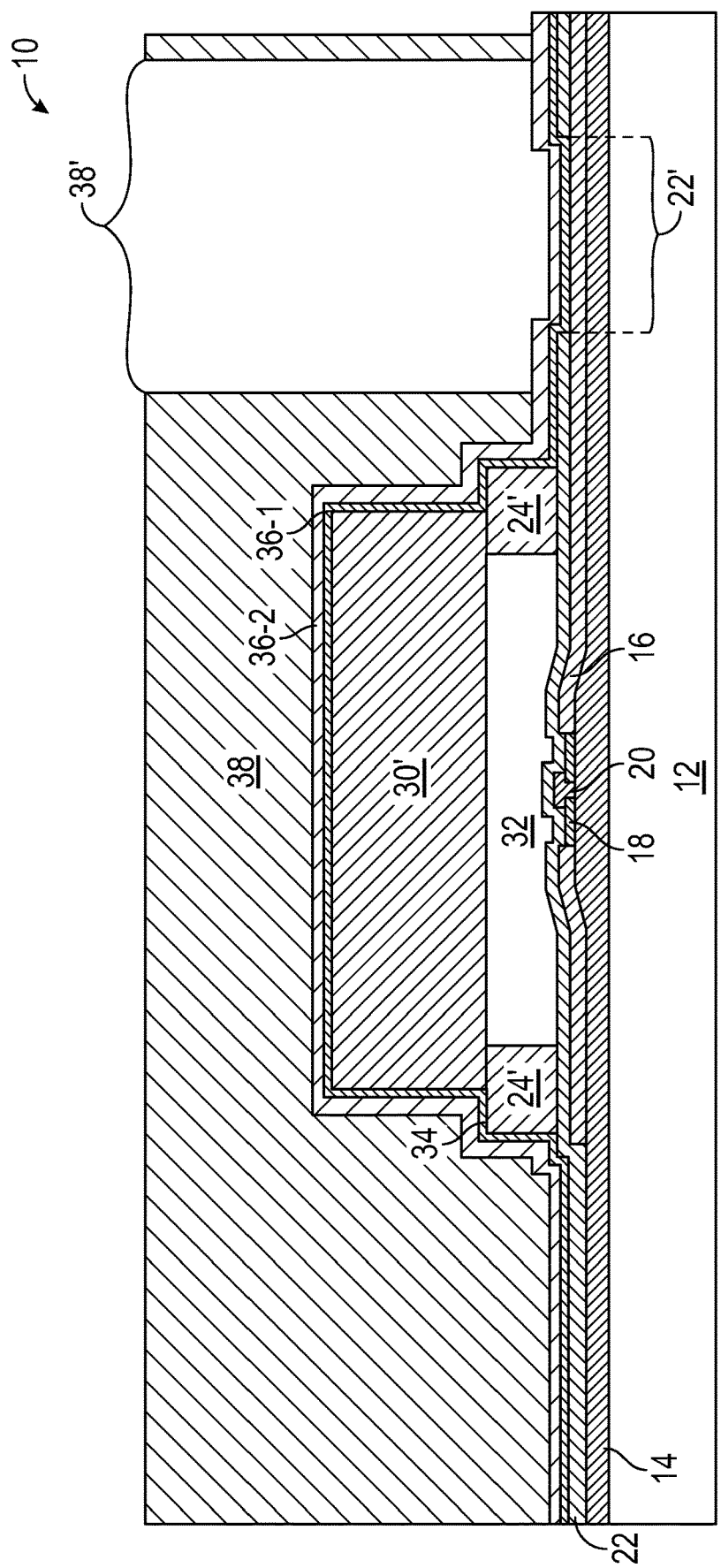
FIG. 8 is a cross-sectional view of the FET of FIG. 7 after a portion of the photo-imagable resist layer is removed over one or more openings of a protective overcoat layer.

FIG. 8 is a cross-sectional view of the FET 10 of FIG. 7 after a portion of the photo-imagable resist layer 38 is removed over the one or more openings 22' of the protective overcoat layer 22. In certain embodiments, a masked lithography step may be employed to form one or more openings 38' in the photo-imagable resist layer 38 in positions that are registered with the one or more openings 22' of the protective overcoat layer 22. In this manner, the one or more openings 38' in the photo-imagable resist layer 38 provide access to portions of the metallization layers 16 by way of the metal layers 36-1, 36-2 for providing external electrical connections to the FET 10.

Figure 9:
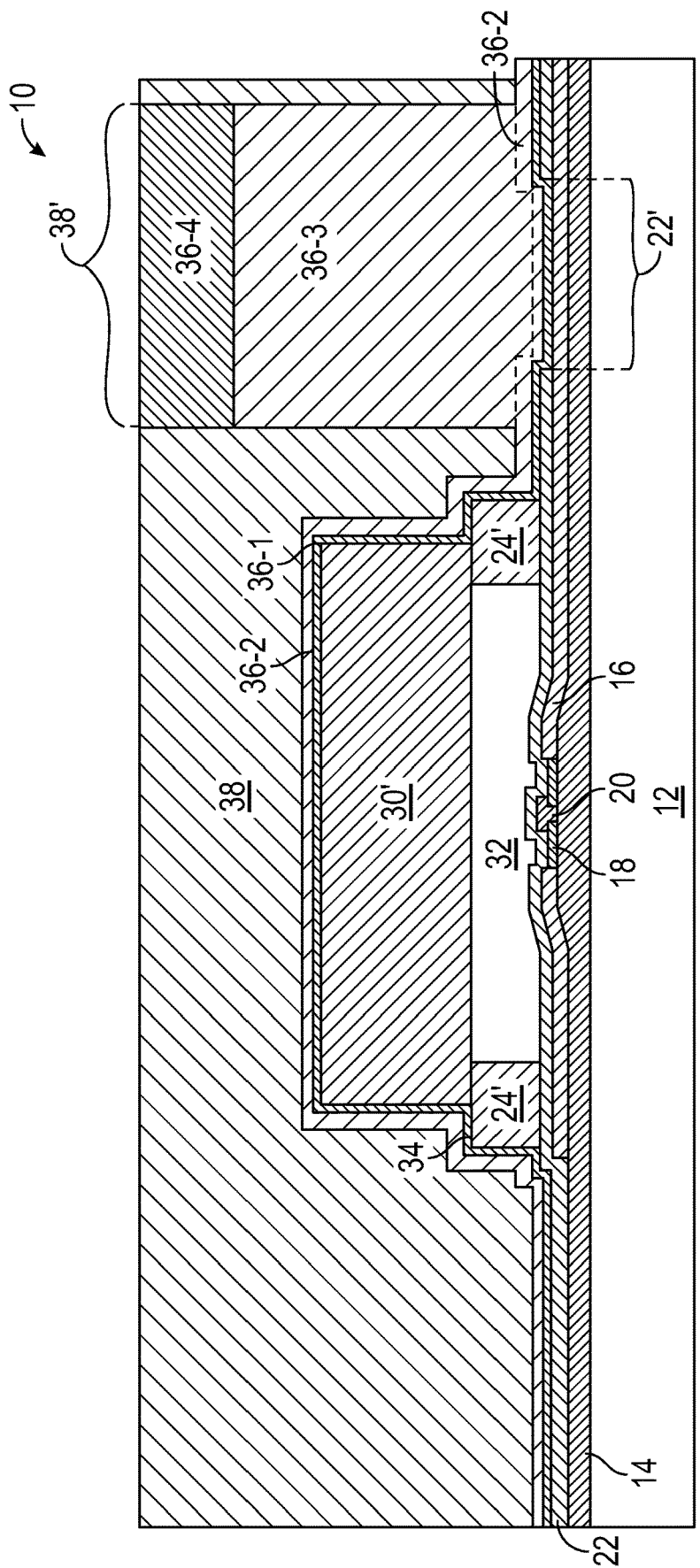
FIG. 9 is a cross-sectional view of the FET of FIG. 8 after the one or more openings in the photo-imagable resist layer of FIG. 8 are filled with one or more additional metal layers, thereby forming one or more conductive pillars that are electrically coupled to the FET.

FIG. 9 is a cross-sectional view of the FET 10 of FIG. 8 after the one or more openings 38' in the photo-imagable resist layer 38 of FIG. 8 are filled with one or more additional metal layers 36-3, 36-4, thereby forming one or more conductive pillars that are electrically coupled to the FET 10. The metal layers 36-3, 36-4 may be deposited by any number of metal deposition techniques, including electroplating or the like to provide the metal layers 36-3, 36-4 with reduced voiding. In certain embodiments, the metal layer 36-3 may comprise a same metal as the metal layer 36-2, for example Cu. In this manner, the metal layer 36-3 may form a continuous metal with the metal layer 36-2. For illustrative purposes, the portion of the original metal layer 36-2 that forms a seed portion of the conductive pillar within the opening 38' is illustrated with a dashed line. The metal layer 36-4 may comprise a different metal, such as tin (Sn), that is configured to receive external electrical connections for the FET 10. As illustrated, the metal layers 36-3, 36-4 may form at least one conductive pillar that extends above the substrate 12 with a height in a direction perpendicular to the substrate 12 that is greater than the photo-imagable polymer structure (e.g., the wall 24' and lid 30'). In this regard, later-described sealing materials, such as an overmold material, may be provided on the FET 10 in an arrangement that also covers the photo-imagable polymer structure while still allowing electrical connections for the FET 10.

Figure 10:
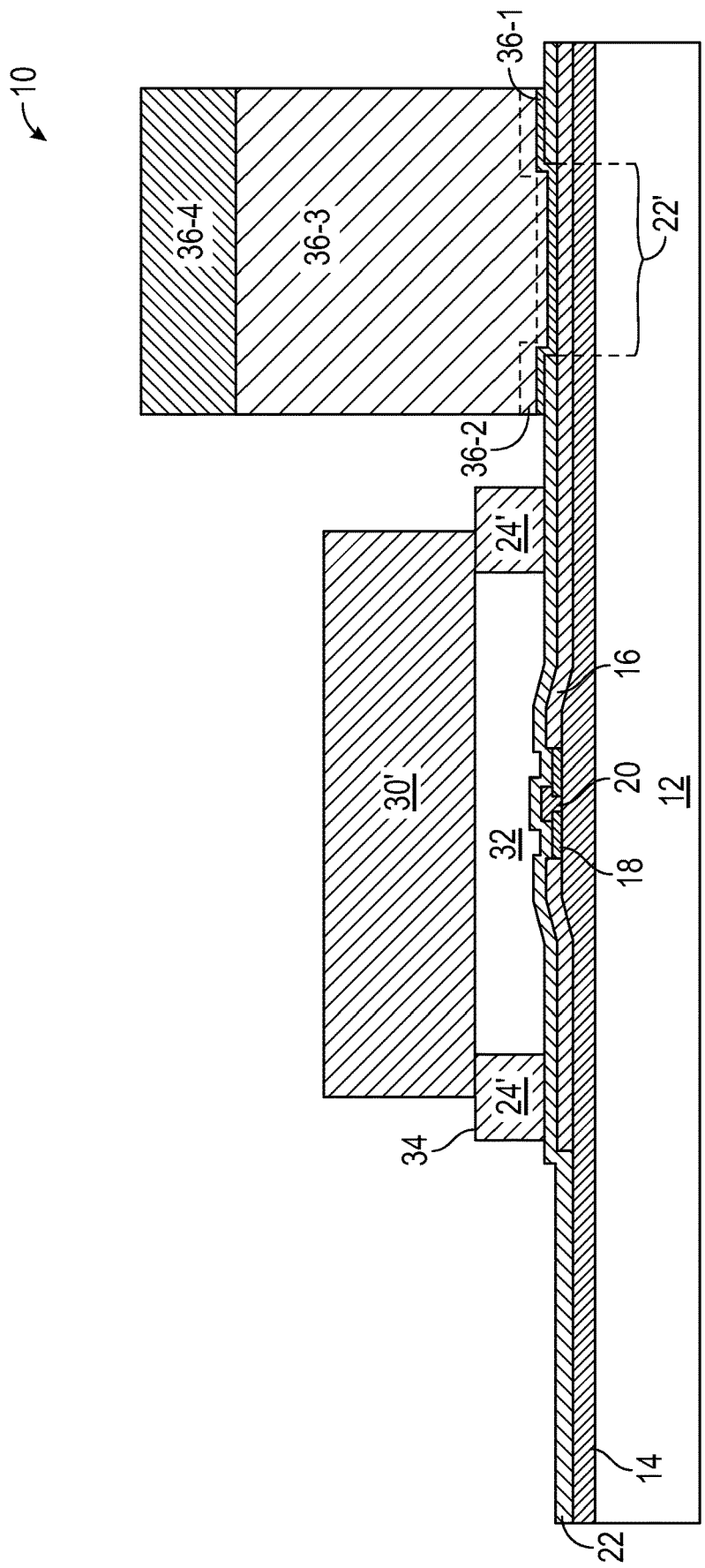
FIG. 10 is a cross-sectional view of the FET of FIG. 9 after the photo-imagable resist layer and portions of the metal layers of FIG. 9 have been removed.

FIG. 10 is a cross-sectional view of the FET 10 of FIG. 9 after the photo-imagable resist layer 38 and portions of the metal layers 36-1, 36-2 of FIG. 9 have been removed. The photo-imagable resist layer 38 may be removed by a photoresist stripping process and portions of the metal layers 36-1, 36-2 on the lid 30', the wall 24', and other portions of the FET 10 may be removed by an etching process. The etching process may embody a masked etch where the at least one conductive pillar formed the metal layers 36-3, 36-4 and portions of the metal layers 36-1, 36-2 remain. As illustrated, the at least one conductive pillar extends above the substrate 12 with a height that is greater than the photo-imagable polymer structure (e.g., the wall 24' and lid 30'). In this regard, later-described sealing materials, such as an overmold material, may therefore be provided on the FET 10 in an arrangement that also covers the photo-imagable polymer structure. For illustrative purposes, a conductive pillar formed by the metal layers 36-1 to 36-4 is illustrated in the cross-sectional view of FIG. 10; however, it is understood that a plurality conductive pillars may be provided for forming a plurality of electrical connections for the FET 10.

Figure 11:
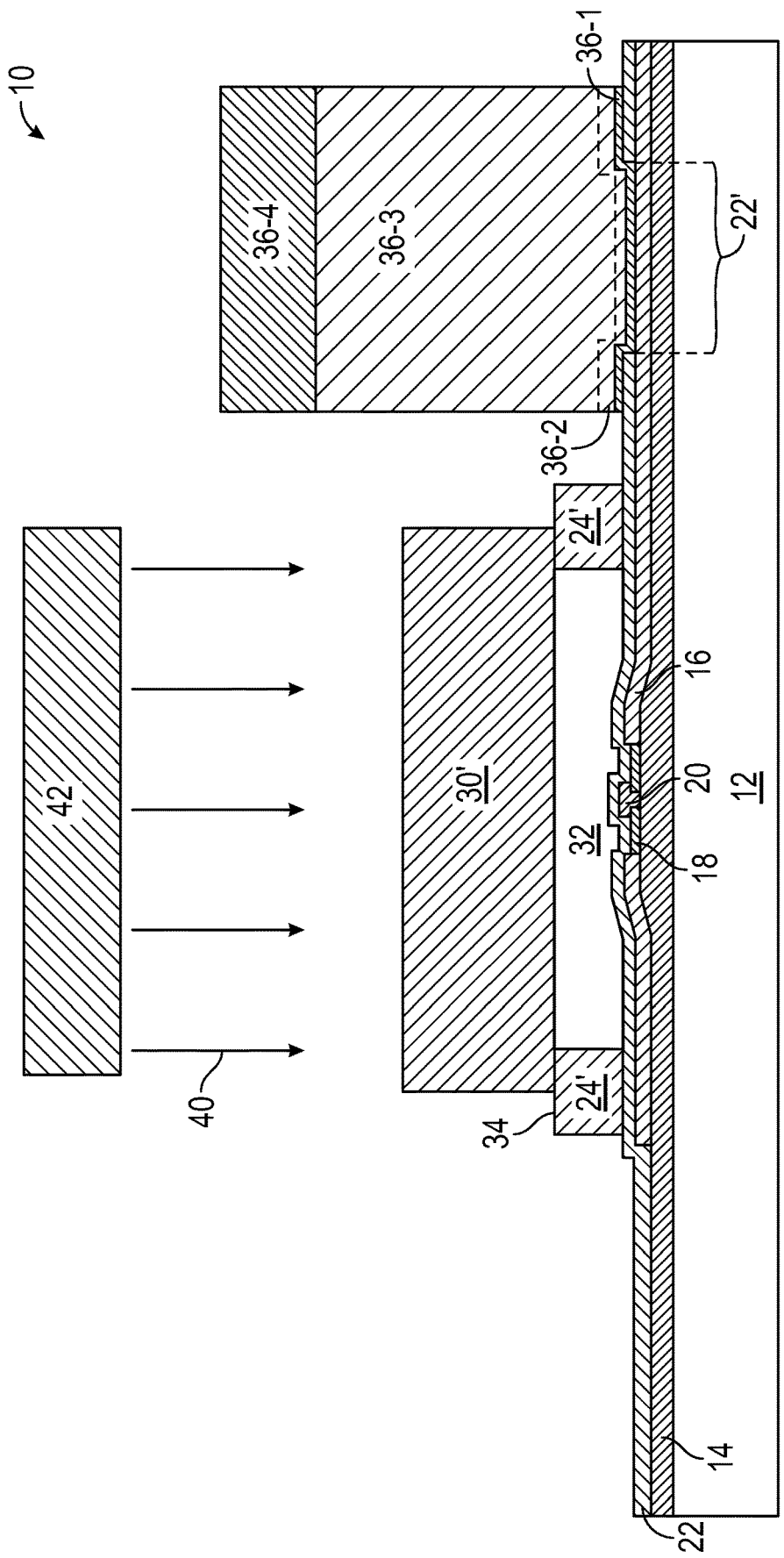
FIG. 11 is a cross-sectional view of the FET of FIG. 10 during radiation hardening of a photo-imagable polymer structure formed by the lid and the walls.

FIG. 11 is a cross-sectional view of the FET 10 of FIG. 10 during radiation hardening of the photo-imagable polymer structure formed by the lid 30' and the at least one wall 24'. Radiation hardening may be performed on the photo-imagable polymers of the lid 30' and walls 24' to improve the mechanical stability thereof. In certain embodiments, radiation hardening may comprise application of radiation 40 from an energy source 42. The energy source 42 may comprise one or more of an electron beam source for use with electron beam rastering, an ultraviolet light source, and an x-ray radiation source. As illustrated, the radiation 40 may be applied to further harden the photo-imagable polymers of the lid 30' and walls 24'. In this regard, mechanical stability of the photo-imagable polymers of the lid 30' and walls 24' may be improved by a multiple step process that includes the polymerizing and/or crosslinking steps described above for FIGS. 3 and 5, followed by the radiation hardening illustrated in FIG. 11. Such a fabrication sequence may advantageously maintain structural integrity of the air cavity 32 in subsequent handling, encapsulation, and/or packing steps, as well as during operation of the FET 10.

Figure 12A:
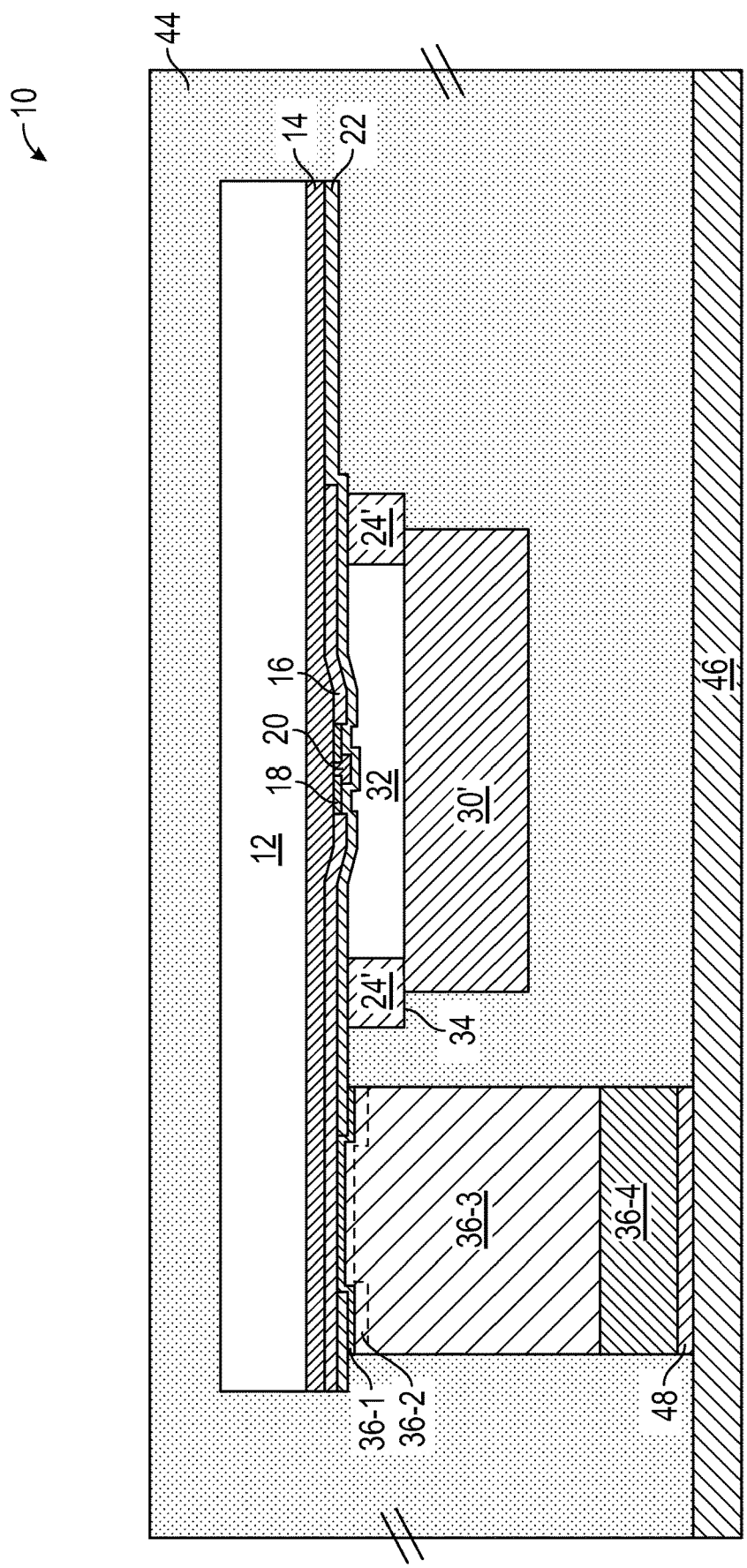
FIG. 12A is a cross-sectional view of exemplary embodiments where an overmold material is formed for encapsulation of a photo-imagable polymer structure and a FET.

FIG. 12A is a cross-sectional view of exemplary embodiments where an overmold material 44 is formed for encapsulation of the photo-imagable polymer structure and the FET 10. As previously described, the overmold material 44 may embody a sealing material that provides protection from environmental ingress of moisture and/or other impurities that would otherwise negatively impact operating characteristics of the FET 10, as well as providing scratch resistance and other mechanical protection. In certain embodiments, the FET 10 may be mounted to a support element 46 before forming the overmold material 44. In certain embodiments, the support element 46 may embody one or more of an FR4 board, a laminate material, and a printed circuit board. The support element 46 may form a monolithic support of a module for radio frequency applications that may include one or more additional discrete circuit elements in addition to the FET 10, including one or more capacitors, resistors, inductors, resonators, filters, and other semiconductor switching devices such as additional FETs. In certain embodiments, additional photo-imagable polymer structures (e.g., similar to the lid 30' and the walls 24' visible in FIG. 12A) may be provided to form other air cavities that are registered with any of the other discrete circuit elements.

As illustrated in FIG. 12A, the FET 10 may be flip-chip mounted to the support element 46 so that the conductive pillar formed by the metal layers 36-1 to 36-4 is electrically coupled to a corresponding electrical trace 48 of the support element 46. For illustrative purposes, a single conductive pillar is shown in FIG. 12A. It is understood the FET 10 may include multiple ones of the conductive pillars formed concurrently during the previously described fabrication steps of FIGS. 1-11. In the flip-chip mounting configuration, the substrate 12 of the FET 10 is provided opposite the one or more device layers 14 and the support element 46 such that the photo-imagable polymer structure is arranged between the substrate 12 and the support element 46. In this regard, the photo-imagable polymer structure, the FET 10, and the corresponding air cavity 32 may be encapsulated and/or embedded within the overmold material 44. In certain embodiments, the overmold material 44 may be molded over the substrate 12 and between the substrate 12 and the support element 46, for example by a compressing molding and/or transfer molding process. As described above, the mechanical stability of the photo-imagable polymers of the lid 30' and walls 24' may be improved by a multiple step process that includes the polymerizing and/or crosslinking steps described above for FIGS. 3 and 5, followed by the radiation hardening as illustrated in FIG. 11. In this regard, the integrity of the air cavity 32 is improved in a manner that allows the air cavity 32 to withstand the molding process, thereby providing a low dielectric constant enclosure for the FET 10 for improved switching speeds.

Figure 12B:
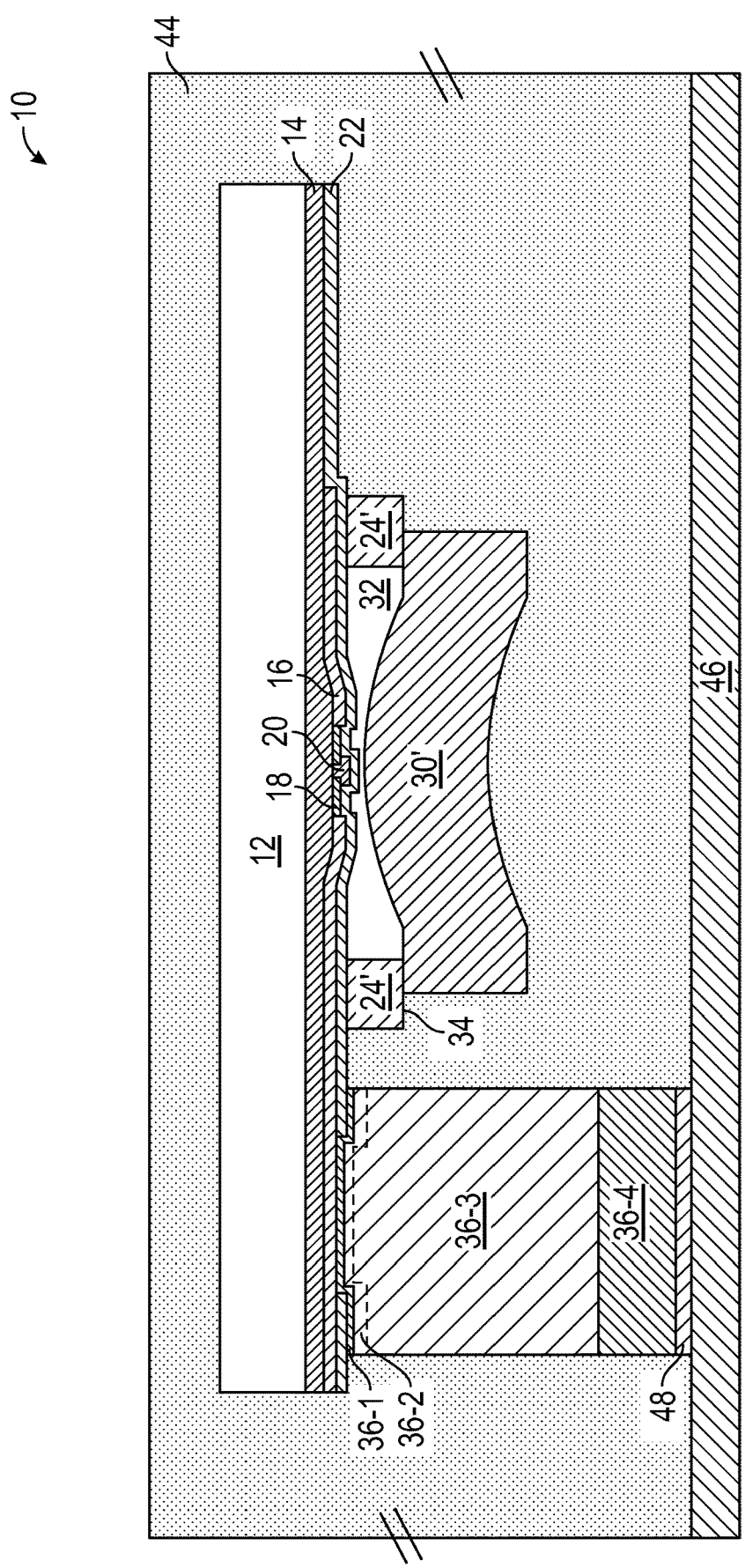
FIG. 12B is a cross-sectional view similar to FIG. 12A for exemplary embodiments where an air cavity partially deforms during molding of the overmold material.

FIG. 12B is a cross-sectional view similar to FIG. 12A for exemplary embodiments where the air cavity 32 partially deforms during molding of the overmold material 44. In some instances, the lid 30' may deform during the molding process described for FIG. 12A. As illustrated, this deformation may narrow the dimensions of the air cavity 32. However, as long as at least some portion of the air cavity 32 entirely remains between the FET 10 and the lid 30', the FET 10 may still be surrounded by the low dielectric constant enclosure for improved switching speeds. In certain embodiments, one or more portions of the lid 30' may deform and/or collapse toward the FET 10 a distance as much as 75% of the height of the walls 24' without impacting switching speeds. In this regard, the time of the radiation hardening step described for FIG. 11 may be reduced or the radiation hardening step may be omitted all together, as long as there is no physical contact between the lid 30' and the FET 10.

While the previously described aspects are provided in the context of a FET, it is readily understood that the principles described are applicable to various discrete circuit elements, including one or more active devices and/or passive devices. As used herein, an active device may include one or more of a transistor, a diode, or any nonlinear microwave device. Exemplary transistors include FETs, metal-oxide-semiconductor field-effect transistors (MOSFETs), bipolar junction transistors (BJTs), and heterojunction bipolar transistor (HBTs). As used herein, a passive device may include one or more of interconnects, capacitors, inductors, resistors, filters, transformers, and couplers.

FIG. 13 is a cross-sectional view of a device 50 that includes at least one of an active device 52 and a passive device 54 with one or more photo-imagable polymer structures and corresponding air cavities 32. In certain aspects, the device 50 may comprise a monolithic device, such as a monolithic microwave integrated circuit (MMIC). In certain aspects, the device 50 may include the active device 52 and/or the passive device 54 that are mounted on the substrate 12. As illustrated, a separate photo-imagable polymer structure may be provided to form a separate one of the air cavity 32 over each of the active device 52 and the passive device 54. Each photo-imagable polymer structure may be formed by the wall 24' and the lid 30' as previously described. In certain embodiments, each photo-imagable polymer structure may further include the step 34 as previously described. In certain embodiments, the air cavity 32 that is registered with the active device 52 may entirely surround the active device 52. In other embodiments, the air cavity 32 may only be formed over a portion of the active device 52 without deviating from the principles disclosed. In a similar manner, the air cavity 32 that is registered with the passive device 54 may entirely surround the passive device 54 or the air cavity 32 may only be formed over a portion of the passive device 54.

Figure 14:
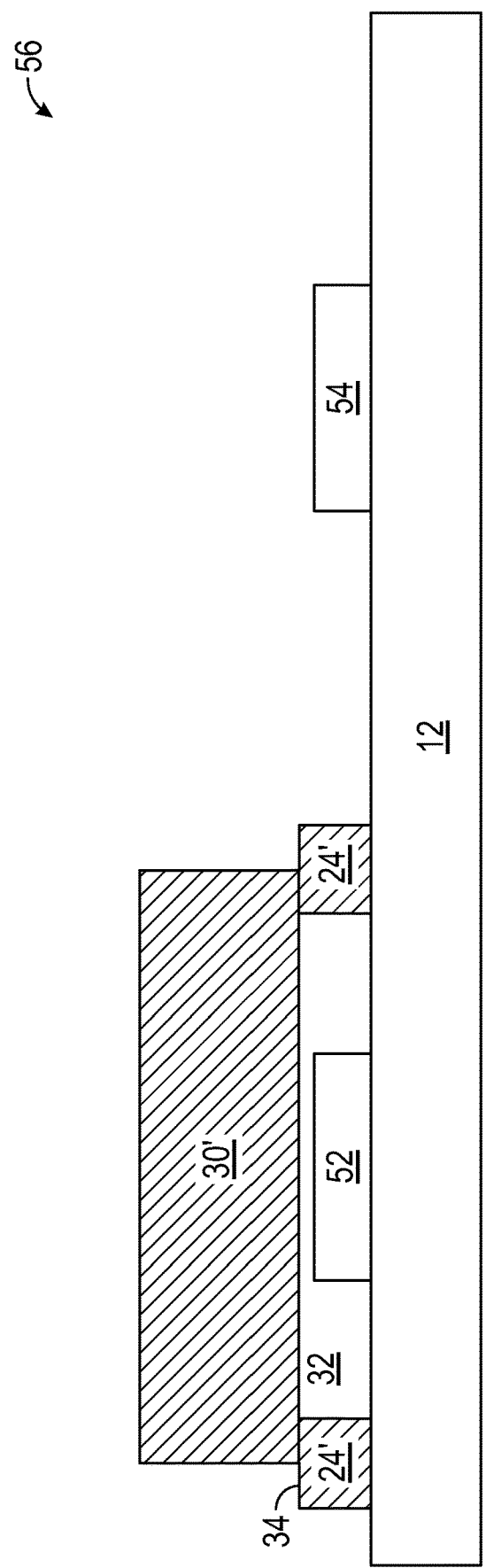
FIG. 14 is a cross-sectional view of a device that is similar to the device of FIG. 13, but includes the photo-imagable polymer structure and corresponding air cavity over the active device and the passive device is arranged outside the air cavity.

FIG. 14 is a cross-sectional view of a device 56 that is similar to the device 50 of FIG. 13, but includes the photo-imagable polymer structure and corresponding air cavity 32 over the active device 52. In this regard, the device 56 may comprise a monolithic device where the air cavity 32 is formed over the active device 52 as previously described, and one or more other devices, including the passive device 54, are provided on the substrate 12 in a position that is outside the air cavity 32. Accordingly, the air cavity 32 may be registered with the active device 52 to provide high frequency enhancements for any active device type in a manner as previously described in the context of FETs in previous embodiments. As with previous embodiments, the air cavity 32 may entirely surround the active device 52 or the air cavity 32 may only be formed over a portion of the passive device 52. In the example where the active device 52 comprises a FET, the air cavity 32 may entirely surround the gate, source, and drain electrodes of the FET, or the air cavity 32 may surround one or more portions of the gate, source, and/or drain electrodes.

Figure 15:
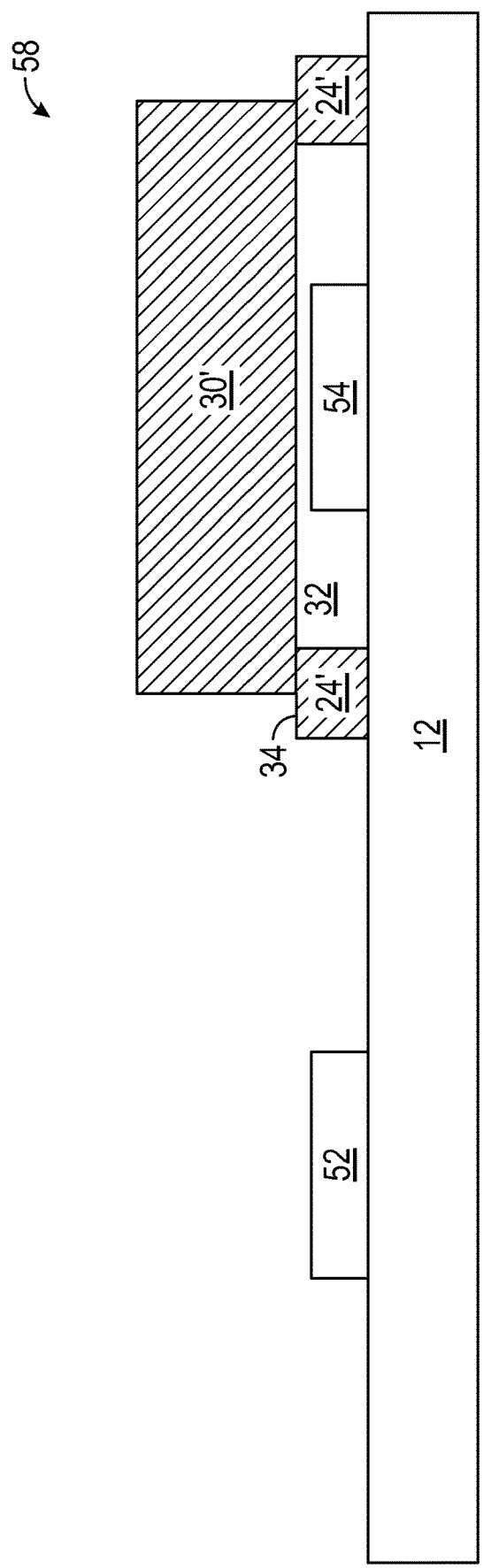
FIG. 15 is a cross-sectional view of a device that is similar to the device of FIG. 13, but includes the photo-imagable polymer structure and corresponding air cavity over the passive device and the active device is arranged outside the air cavity.

FIG. 15 is a cross-sectional view of a device 58 that is similar to the device 50 of FIG. 13, but includes the photo-imagable polymer structure and corresponding air cavity 32 over the passive device 54. In this regard, the device 58 may comprise a monolithic device where the air cavity 32 is formed over the passive device 54, and one or more other devices, including the active device 52, are provided on the substrate 12 in a position that is outside the air cavity 32. Accordingly, the air cavity 32 may be registered with the passive device 54 to provide high frequency enhancements for any passive device type. For example, the passive device 54 may embody a spiral inductor that is integrated on the monolithic device, and the corresponding air cavity 32 may provide enhancements for use in higher frequency operating conditions. As with previous embodiments, the air cavity 32 may entirely surround the passive device 54 or the air cavity 32 may only be formed over a portion of the passive device 54.

Figure 16:
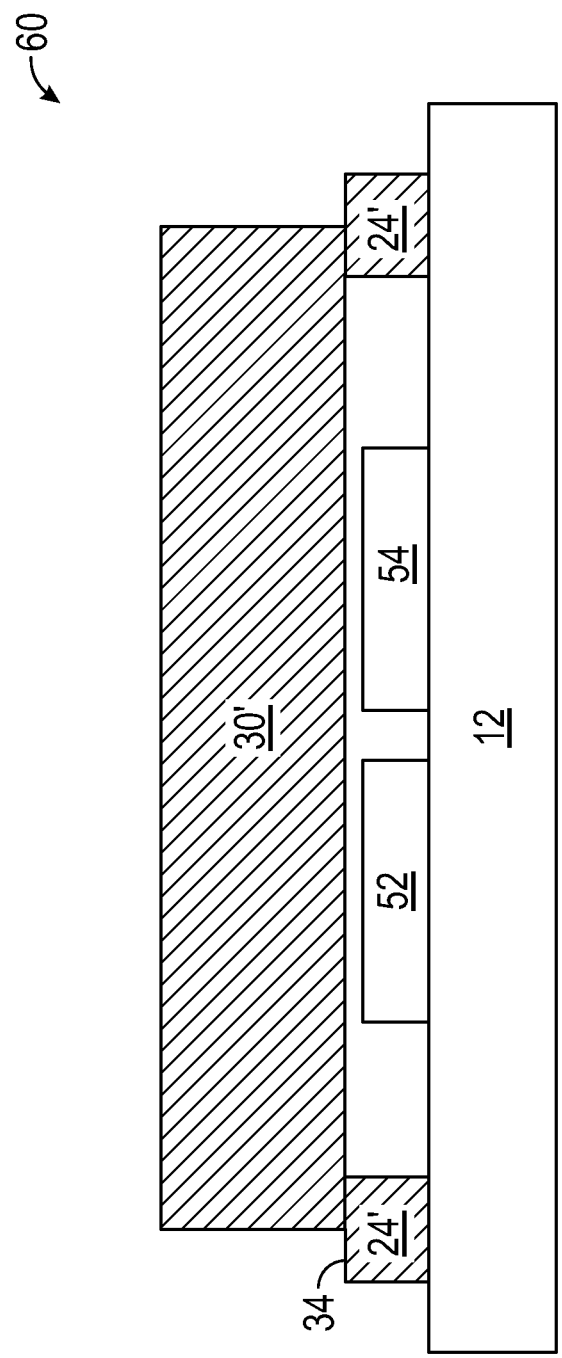
FIG. 16 is a cross-sectional view of a device that is similar to the device of FIG. 13 for embodiments where the photo-imagable polymer structure and corresponding air cavity may be formed over both the active device and the passive device.

FIG. 16 is a cross-sectional view of a device 60 that is similar to the device 50 of FIG. 13 for embodiments where the photo-imagable polymer structure and corresponding air cavity 32 may be formed over both the active device 52 and the passive device 54. The device 60 may embody a monolithic device with a layout that allows both the active device 52 and the passive device 54 to be enclosed under a single air cavity 32. In this regard, the single air cavity 32 may provide the high frequency enhancements for both the active device 52 and the passive device 54 as previously described for FIGS. 14 and 15.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A device comprising:
a substrate;
a field-effect transistor (FET) on the substrate, the FET comprising at least one gate electrode;
a photo-imagable polymer structure on the substrate and over the gate electrode, wherein the photo-imagable polymer structure forms an air cavity over the at least one gate electrode;
an overmold material, wherein the photo-imagable polymer structure is embedded within the overmold material such that the overmold material is arranged to encapsulate the FET and the photo-imagable polymer structure; and
a support element, wherein the FET is flip-chip mounted to the support element, and the overmold material is arranged between the photo-imagable polymer structure and the support element.

2. The device of claim 1, wherein the photo-imagable polymer structure comprises at least one wall on the substrate that is peripherally arranged around the at least one gate electrode.

3. The device of claim 2, wherein a height of the at least one wall in a direction perpendicular to the substrate is greater than a height of the at least one gate electrode in a direction perpendicular to the substrate.

4. The device of claim 2, wherein the photo-imagable polymer structure further comprises a lid that resides on the at least one wall such that the at least one wall is arranged between the lid and the substrate, wherein the lid is spaced above the at least one gate electrode to form the air cavity.

5. The device of claim 4, wherein the lid and the at least one wall comprise a same photo-imagable polymer.

6. The device of claim 4, wherein the lid and the at least one wall form a unitary element for the photo-imagable polymer structure.

7. The device of claim 4, wherein the lid and the at least one wall form a step along one or more sidewalls of the photo-imagable polymer structure.

8. The device of claim 4, wherein a thickness of the lid is greater than a thickness of the at least one wall.

9. The device of claim 8, wherein the thickness of the at least one wall is in a range from 10 microns (μm) to 30 μm and the thickness of the lid is in a range from 20 μm to 70 μm.

10. The device of claim 1, further comprising one or more conductive pillars that are arranged to extend through the overmold material to provide one or more electrical connections between the FET and the support element.

11. A method comprising:
forming a field-effect transistor (FET) on a substrate, the FET comprising at least one gate electrode;
forming a photo-imagable polymer structure on the substrate and over the at least one gate electrode, wherein the photo-imagable polymer structure forms an air cavity over the at least one gate electrode;
flip-chip mounting the FET to a support element; and
encapsulating the photo-imagable polymer structure and the FET in an overmold material such that a portion of the overmold material is arranged between the photo-imagable polymer structure and the support element.

12. The method of claim 11, further comprising applying radiation to harden the photo-imagable polymer structure after the air cavity is formed.

13. The method of claim 12, wherein the radiation is provided by a radiation source that comprises at least one of an electron beam source, an ultraviolet source, and an x-ray source.

14. The method of claim 11, wherein the photo-imagable polymer structure comprises at least one wall and a lid that resides on the at least one wall to form the air cavity.

15. The device of claim 14, wherein the lid and the at least one wall form a step along one or more sidewalls of the photo-imagable polymer structure.

16. The method of claim 14, wherein:
the at least one wall is formed by laminating a first photo-imagable polymer layer on the FET and selectively polymerizing or crosslinking portions of the first photo-imagable polymer layer; and
the lid is formed by laminating a second photo-imagable polymer layer on the at least one wall and selectively polymerizing or crosslinking portions of the second photo-imagable polymer layer.

17. The method of claim 16, further comprising applying radiation to harden the lid and the at least one wall.

18. The method of claim 17, further comprising molding the overmold material to enclose the photo-imagable polymer structure after hardening of the lid and the at least one wall.

19. A monolithic device comprising:
a substrate;
at least one of an active device and a passive device on the substrate;
a photo-imagable polymer structure on the substrate, wherein the photo-imagable polymer structure comprises at least one wall and a lid that resides on the at least one wall such that the photo-imagable polymer structure forms an air cavity that is over at least one of a portion of the active device and a portion of the passive device; and
an overmold material on the photo-imagable polymer structure, wherein the lid and the at least one wall form a step along one or more sidewalls of the photo-imagable polymer structure that contact the overmold material.

20. The monolithic device of claim 19, wherein the air cavity is over the entire active device.

21. The monolithic device of claim 19, wherein the air cavity is over the entire passive device.

22. The monolithic device of claim 19, wherein the air cavity is over at least a portion of both the active device and the passive device.

23. The monolithic device of claim 19, wherein the air cavity is over the portion of the active device, and the active device comprises at least one of a transistor and a diode.

24. The monolithic device of claim 19, wherein the air cavity is over the portion of the passive device, and the passive device comprises at least one of an interconnect, a capacitor, an inductor, a resistor, a filter, a transformer, and a coupler.

* * * * *